United States Patent [19]

Colleran et al.

[11] Patent Number: 5,376,937
[45] Date of Patent: Dec. 27, 1994

[54] FOLDING CIRCUIT

[75] Inventors: William T. Colleran, Manhattan Beach; Asad A. Abidi, Pacific Palisades, both of Calif.

[73] Assignee: The Regents of the University of California, Oakland, Calif.

[21] Appl. No.: 20,477

[22] Filed: Feb. 22, 1993

[51] Int. Cl.$^5$ .............................................. H03M 1/36
[52] U.S. Cl. ..................................... 341/159; 341/155
[58] Field of Search ........................... 341/155, 158, 159

[56] References Cited

U.S. PATENT DOCUMENTS

| | | | |
|---|---|---|---|
| 2,922,151 | 1/1960 | Reiling | 340/347 |
| 3,573,798 | 4/1971 | Reiling | 340/347 |
| 4,270,118 | 5/1981 | Brokaw | 340/347 |
| 4,297,679 | 10/1981 | Arbel et al. | 340/347 |
| 4,325,054 | 4/1982 | van de Plassche | 340/347 |
| 4,386,339 | 5/1983 | Henry et al. | 340/347 |
| 4,456,904 | 6/1984 | van de Grift | 340/347 |
| 4,617,523 | 10/1986 | Taylor | 330/261 |
| 4,816,831 | 3/1989 | Mizoguchi et al. | 341/156 |
| 4,839,653 | 6/1989 | Devito | 341/157 |
| 4,924,227 | 5/1990 | Mangelsdorf | 341/159 |
| 5,157,397 | 10/1992 | Vernon | 341/157 |
| 5,231,399 | 7/1993 | Gorman et al. | 341/159 |

FOREIGN PATENT DOCUMENTS

1497806 1/1978 United Kingdom .
WO9208288 5/1992 WIPO .

OTHER PUBLICATIONS

W. T. Colleran et al., "Compact high speed A/D converters", Final Report 1990-91, Micro Project No. 90-002.
W. T. Colleran et al., "Highly integrated gigahertz A/D converters", Final Report 1989-90, Micro Project No. 89-164.
W. T. Colleran et al., "Compact high frequency A/D converters", Micro Program, 1988-89.
R. Petschacher, et al., "A 10-b 75-MSPS subranging A/D converter with integrated sample and hold", *IEEE Journal of Solid-State Circuits*, vol. 25, No. 6, pp. 1339-1346, Dec. 1990.
R. E. J. van de Grift et al., "An 8 bit video ADC incorporating folding and interpolation techniques", *IEEE Journal of Solid-State Circuits*, vol. SC-22, No. 6, pp. 944-953, Dec. 1987.
J. J. Corcoran, et al., "A 400MHz 6b ADC", in *International Solid State Circuits Conference*, pp. 294-295, IEEE. Feb. 1984.
A. Arbel et al., "Fast ADC", *IEEE Transactions on Nuclear Science*, vol. NS-22, Feb. 1975.
U. Fiedler et al., "A high-speed 8 bit A/D converter based on a gray-code multiple folding circuit", *IEEE Journal of Solid-State Circuits*, vol. SC-14, No. 3, pp. 547-551, Jun. 1979.

(List continued on next page.)

*Primary Examiner*—Brian K. Young
*Attorney, Agent, or Firm*—Spensley Horn Jubas & Lubitz

[57] ABSTRACT

A folding circuit includes a differential resistance ladder and a plurality of comparators coupled to the differential resistance ladder in a manner which substantially reduces capacitive loading on the differential ladder. In addition, the folding circuit has a minimum number of output resistors to facilitate resistor matching for precision outputs. In another aspect of the invention, the folding circuit has a replica gain matching circuit which includes a replica comparator of predetermined size, which is coupled to a replica differential ladder at a predetermined location so as to replicate the currents drawn by the comparators coupled to the main differential resistance ladder for precise gain matching.

17 Claims, 8 Drawing Sheets

OTHER PUBLICATIONS

D. Daniel et al., "A silicon bipolar 4–bit 1–Gsample/s full nyquist A/D converter", *IEEE Journal of Solid State Circuits*, vol. SC–23, No. 3, pp. 742–749, Jun. 1988.

R. J. van de Plassche et al., "An 8-bit 100-MHz full-nyquist analog-to-digital converter", *IEEE Journal of Solid State Circuits*, vol. 23, No. 6, pp. 1334–1344, Dec. 1988.

R. J. van de Plassche et al., "An 8b 100MHz folding ADC", in *International Solid State Circuits Conference*, pp. 222–223, IEEE, Feb. 1988.

R. E. J. van de Grift et al., "An 8b 50MHz video ADC with folding and interpolation techniques", in *International Solid State Circuits Conference*, pp. 94–95, IEEE, Feb. 1987.

B. Gilbert, "Monolithic analog READ-ONLY memory for character generation", *IEEE Journal of Solid State Circuits*, vol. SC–6, pp. 45–55, Feb. 1971.

J. V. Woods et al., "Fast synthesized cyclic-parallel analogue-digital converter", *IEEE Proceedings*, vol. 127, pp. 45, 51, Apr. 1980.

FOLDING CIRCUIT

BACKGROUND OF THE INVENTION

1. Field of the Invention

The present invention relates to folding circuits, and more particularly to folding circuits having a resistive ladder.

2. Description of Related Art

A folding circuit provides an output waveform which ideally is a piecewise-linear periodic function of its input signal. This "folded" waveform can have a substantially smaller dynamic range than the input signal. As a consequence, a folding circuit can be very useful in an analog-to-digital converter (ADC) because the folded waveform can be digitized utilizing substantially fewer comparators than those which are typically required in a conventional parallel or "flash" analog-to-digital converter.

A parallel converter compares the analog input signal to a series of equally spaced reference voltages or thresholds. Typically, the reference voltages are produced by a voltage source applied to a voltage divider circuit such as a resistive ladder to provide the multiple reference voltage levels. The comparison of the analog input signal to the reference voltages is usually performed by a bank of comparators. A typical n-bit flash converter requires $2^n - 1$ comparators. Thus, for example, a flash converter having 8 bits of resolution can require as many as 255 comparators. In contrast, the number of comparators required by a converter using a folding circuit can be substantially reduced because of the smaller dynamic range at the output of the folding circuit as noted above.

FIG. 2 shows an example of a typical folding circuit. As shown therein, the folding circuit includes a plurality of differential transistor pairs, in which one input of each transistor pair is tied to a particular node of a resistive ladder which provides a series of successively increasing reference voltages. The other input of each differential pair is coupled to the input signal. As explained in greater detail below, the outputs of the differential pairs are suitably coupled to generate a periodic output, typically a sinusoid. One disadvantage of such an arrangement is that the load resistors of each differential pair must typically match each other in order to provide an accurate sinusoidal output. In addition, because each differential transistor pair is coupled to the input of the circuit, the differential transistor pairs capacitively load the input, which can substantially slow the operation of the converter.

Another problem associated with folding circuits, particularly those circuits which utilize bipolar transistor differential pairs, is that the transistors coupled to the resistive ladder draw a base current which flows through the resistive reference ladder. As a consequence, the reference voltages can be perturbed by the base currents which in turn distorts the sinusoidal output of the circuit. As a result, inaccuracies in the conversion of the input signal can occur.

SUMMARY OF THE INVENTION

It is an object of the present invention to provide an improved folding circuit, obviating, for practical purposes, the above-mentioned limitations, particularly in a manner requiring a relatively uncomplicated electronic arrangement.

These and other objects and advantages are achieved in a folding circuit for providing a periodic output, comprising in accordance with a preferred embodiment of the present invention, a differential resistive ladder which includes a first plurality of series-connected resistors having a plurality of tap points along the series-connected resistors, and a second plurality of series-connected resistors having a plurality of tap points along the second plurality of series-connected resistors. The circuit further includes first and second inputs for applying a differential input signal to the differential resistive ladder, and a plurality of comparators, each comparator having a first input coupled to a tap point of the first plurality of series-connected resistors and a second input coupled to a tap point of the second plurality of series-connected resistors.

As explained in greater detail below, the outputs of the comparators are coupled so as to provide a highly accurate periodic output waveform, which in the illustrated embodiment, is a sinusoid. The output circuitry has a substantially reduced number of resistors so as to facilitate accurate matching of the output resistors. In addition, because half of the comparator inputs are coupled to one plurality of series-connected resistors of the differential resistive ladder and the other comparator inputs are coupled to the complementary series-connected resistors of the differential resistive ladder, cancellation of the effective capacitance of the comparators is substantially achieved, thereby substantially reducing the capacitive loading on the differential resistive ladder.

In another aspect of the present invention, a replica gain matching circuit is provided for the differential resistive ladder. As explained in greater detail below, the replica circuit includes not only a scaled differential resistive ladder but also scaled comparators coupled to the reference ladder of the replica. As a consequence, errors in the reference voltages of the main differential resistive ladder, which are caused by input currents drawn by the comparators, are compensated.

DETAILED DESCRIPTION OF THE DRAWINGS

Figure 1:
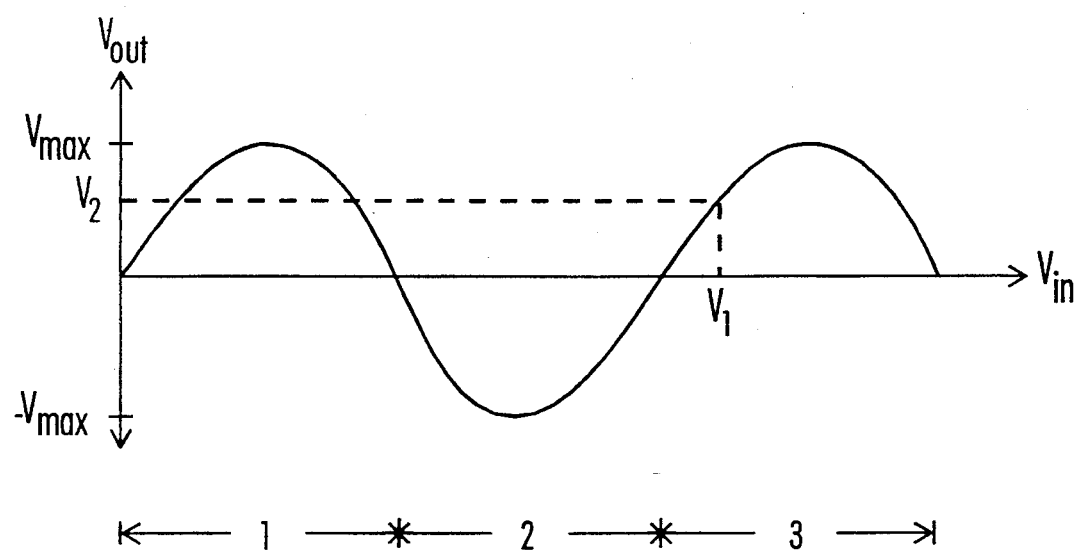
FIG. 1 depicts the sinusoidal output of a folding circuit in response to a ramped input voltage.

FIG. 1 is a graph depicting the output $V_{out}$ of a folding circuit in response to a ramped input voltage $V_{in}$. In a preferred embodiment of the present invention, a folding circuit provides a true sinusoidal output as illustrated in FIG. 1. However, it should be appreciated that the output circuitry of the folding circuit can be modified to provide a number of different periodic waveforms including triangular waveforms.

As shown in FIG. 1, as the analog input voltage $V_{in}$ increases, the output voltage of the folding circuit first rises and then falls as the input voltage $V_{in}$ continues to increase. The first zero crossing of the output voltage $V_{out}$ marks the end of cycle 1 and the beginning of the cycle 2. As the input voltage $V_{in}$ continues to increase, the output voltage $V_{out}$ continues to fall until the middle of cycle 2, at which time the output voltage $V_{out}$ rises through the next zero crossing marking the end of cycle 2.

In this manner, the input voltage $V_{in}$ is "folded" so that the output voltage $V_{out}$ does not exceed a maximum voltage $V_{max}$. For example, an input voltage $V_1$ may correspond to a particular output voltage $V_2$ which is less than the maximum voltage $V_{max}$. A coarse quantizer (not shown) determines which cycle of the output waveform the input voltage $V_1$ corresponds (i.e., cycle 3) which provides the coarse bits of the analog-to-digital conversion. A fine quantizer (not shown) converts the output voltage $V_2$ generated in response to the input voltage $V_1$ to the remaining fine bits of the analog-to-digital conversion.

It is apparent that the full dynamic range ($V_{max}$ to $-V_{max}$) of the folding circuit can be substantially reduced as compared to the input voltage $V_{in}$. As a consequence, the number of comparators needed for the full analog-to-digital conversion can be substantially reduced as compared to those that would be required by a full parallel analog-to-digital converter circuit.

Figure 2:
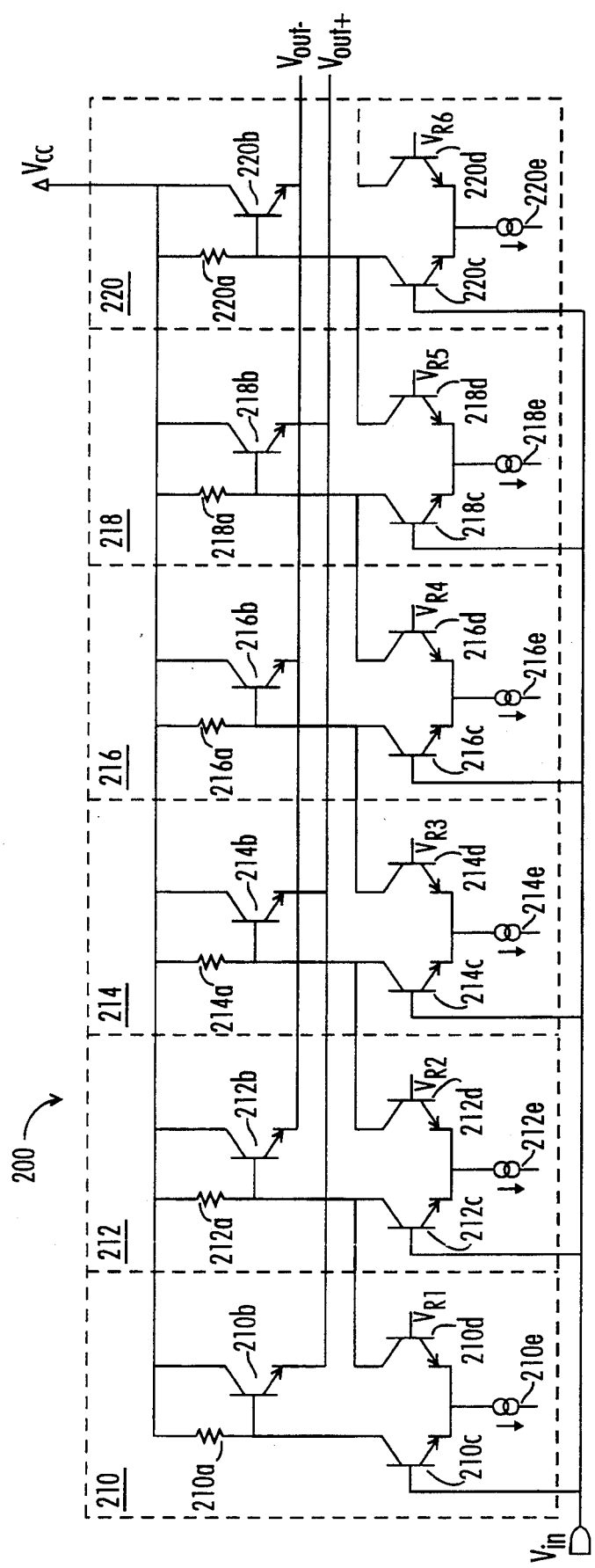
FIG. 2 is a schematic diagram of a previous folding circuit.

FIG. 2 is a schematic diagram of a prior folding circuit 200 having a plurality of folding stages 210–220, each of which receives an input voltage $V_{in}$. The outputs of the folding stages 210–220 are selectively combined to provide a differential output voltage $V_{out}$.

In each folding stage, the folding operation is performed by a differential transistor pair formed from first and second bipolar input transistors whose emitters are coupled to a current source. For example, first and second bipolar transistors 210c–210d of stage 210 form a differential transistor pair, the emitters of which are coupled to a current source 210e. The base of the first transistor 210c is coupled to $V_{in}$ and the base of the second transistor 210d is coupled to a reference voltage $V_{R1}$. In a similar manner, the base of the second input transistor 212d of the second stage 212 is coupled to a second reference voltage $V_{R2}$, the base of the second input transistor 214d of the stage 214 is coupled to a third reference voltage $V_{R3}$, etc. The reference voltages $V_{R1}$–$V_{R6}$ for each of the six stages 210–220, respectively, are provided by a resistor ladder (not shown) having voltage taps equally spaced across the input range of the analog-to-digital converter.

The collector of each first input transistor 210c–220c has a resistor load 210a–220a, respectively. The collector of each second input transistor 210d–220d is coupled to the resistor load of the next folding stage. For example, the collector of the second input transistor 210d is coupled to the resistor load 212a of the next folding stage 212. Each of the stages 210–220 further includes a third transistor 210b–220b which couples the resistor load of the stage to one of the outputs $V_{out+}$ or $V_{out-}$. More specifically, the resistor loads 210a, 214a and 218a of the stages 210, 214 and 218, respectively, are coupled to the output $V_{out+}$ through the associated third transistor 210b, 214b, 218b, respectively, with wired-OR connections. Conversely, the alternate resistor loads 212a, 216a and 220a of the folding stages 212, 216 and 220, respectively, are coupled to the output $V_{out-}$ through the associated third transistor 212b, 216b and 220b, respectively, with wired-OR connections.

In operation, if a ramp input signal $V_{in}$ is input into the folding stages 210–220, the differential pairs in stages 212–220, will each, in succession, ideally produce a single triangular wave. When the outputs from the folding stages are summed, to produce complementary output signals $V_{out+}$ and $V_{out-}$, the resulting signals have the appearance a repetitive triangular wave with a frequency of K times the frequency of the input ramp, where K is the number of folding pairs of stages in the circuit. In the example of FIG. 2, there are three pairs of stages such that K=3.

If, at a particular point in time, the analog input signal $V_{in}$ equals a reference voltage which is coupled to one of the folding stages (for example, $V_{in}$ equals $V_{R3}$ of the folding stage 214), the differential pair transistors 214c and 214d are balanced and have collector currents each equal to one-half of the current from current source 214e (neglecting base currents). Ideally, the adjacent folding stages 212 and 216 should be off and produce no output. However, when the voltage difference between reference taps is small (for example, less than a few hundred millivolts), the adjacent folding stages are not completely switched off and transistors 212d and 216c are not completely shut off. The currents through transistors 212d and 216c are equal because current sources 212e and 216e are equal and the voltage differences between reference taps are equal. As a result, the voltage drops across load resistors 214a and 216a are equal and only the wired-OR transistors 214b and 216b are on. Because the currents through wired-OR transistors 214b and 216b are equal and because their base emitter voltage drops are equal, the output of folding stage 214 is balanced (zero). Thus, an input voltage equal to an interior reference voltage causes a differential output of zero since equal currents in adjacent folding stages, which are not completely switched, cause equal voltage drops. In this manner, as the input voltage passes through each reference voltage $V_{R1}$–$V_{R6}$, the output voltage passes through a zero crossing, resulting in a periodic folded output.

The output of the folding circuit is ideally a triangular waveform. In practice, however, the output resembles a triangular wave which has been rounded at the extreme values (at the peaks and troughs). In fact, the output resembles a sinusoid. The waveform shape is due to the imperfect switching of the differential pairs in the folding stages and results in extreme non-linearity at the peaks and troughs where the output may be almost constant despite the change in the input.

The above-described circuit of FIG. 2 has a number of disadvantages. First, each input transistor 210c–220c connected to the input $V_{in}$ capacitively loads the input. Because prior input stages typically have a finite current drive capability, the capacitive loading on the input can significantly slow the operation of the circuit. In addition, in order to produce an accurate output waveform, each of the load resistors 210a–220a usually must be carefully matched. For converter circuits having a large number of stages, on the order of 20 or more, matching the load resistors of each of the stages can be particularly troublesome.

Still further, each of the input transistors 210d–220d coupled to the resistive reference ladder draws base current at different times as the input voltage rises. These base currents flow through the resistive ladder and perturb the voltage drops across the resistors of the reference ladder. As a consequence, the reference values $V_{R1}$–$V_{R6}$ are perturbed as the transistors turn on and off, distorting the output waveform, thereby causing inaccuracies in the analog-to-digital conversion.

In addition, for input voltages, $V_{in}$, near the upper and lower reference voltages, $V_{R1}$ and $V_{R6}$, respectively, the folding amplifier output can deviate from the ideal output waveform. Specifically, if the analog input voltage $V_{in}$ equals a reference voltage which is coupled to one of the two end folding stages 210 or 220 (for example, $V_{in}$ equals $V_{R1}$), the differential pair transistors 210c and 210d in folding stage 210 are balanced and have equal collector currents. The transistor 212c of the adjacent folding stage is not completely switched off resulting in a non-zero current through transistor 212c. Consequently, the voltage drop across load resistor 210a is not equal to the voltage drop across load resistor 212a (the latter drop being due to the sum of the currents through transistors 210d of folding stage 210 and 212c of folding stage 212). Wired-OR transistors 210b and 212b are on and the difference between the voltage drops across load resistors 210a and 212a is transferred to the output. Consequently, an input voltage level equal to one of the extreme reference voltages results in an unbalanced (non-zero) differential output because of the non-symmetry of folding stages above and below the active folding stage.

A folding circuit in accordance with a preferred embodiment is indicated generally at 300 in FIGS. 3(a and 3(b). As explained in greater detail below, the folding circuit 300 reduces or eliminates many of the above-described problems of prior folding circuits. The folding circuit 300 includes a differential resistive ladder 310 which has a differential input for the input signal $V_{in+}$ and its complementary signal $V_{in-}$. The input signal $V_{in+}$ is coupled through an input transistor 312a to a plurality of series-connected threshold resistors 314a–323a which are in turn series-connected to a variable current source 332a. Similarly, the complementary input signal $V_{in-}$ is coupled through an input transistor 312b to a plurality of series-connected threshold resistors 314b–323b which are series-connected to a variable current source 332b. The threshold resistors are each of equal value.

The folding circuit 300 further includes a plurality of folding stages 340–360. Each folding stage of the folding circuit 300 includes a pair of differential input transistors, the inputs of which are connected to complementary nodes of the differential resistive ladder 310. In the illustrated embodiment, the folding circuit 300 has eleven such folding stages and each resistive ladder 314a–323a and 314b–323b has eleven nodes or voltage taps 0–10 and $\overline{0}$–$\overline{10}$, respectively. Thus, for example, the folding stage 340 includes input transistors 340a and 340b, the inputs of which are connected to the differential resistive ladder nodes 0 and $\overline{10}$, respectively. Similarly, the inputs of the differential input transistors 342a and 342b of the folding stage 342 are connected to the nodes 1 and $\overline{9}$ of the differential resistive ladder 310. As the input voltage to each resistive ladder changes, the voltages at the various voltage taps 0–10 and $\overline{0}$–$\overline{10}$ track the changes in the associated input voltage, with the voltages at adjacent nodes being separated by a threshold voltage which is the voltage drop across the resistor separating the two adjacent nodes.

The collectors of the first input transistor of each alternate folding stage are connected to the emitter of one of two cascode-connected output transistors 370a and 370b. Thus, for example, the first input transistors 340a, 344a, 348a, 352a, 356a and 360a of the folding stages 340, 344, 348, 352, 356 and 360, respectively, are each connected to a common node 380a at the emitter of the cascode-connected output transistor 370a. Similarly, the second input transistors 342b, 346b, 350b, 354b, and 358b of the alternate folding stages 342, 346, 350, 354 and 358, respectively, are also connected to the common node 380a at the emitter of the cascode-connected output transistor 370a. Conversely, the collectors of the second input transistors of the folding stages 340, 344, 348, 352, 356 and 360 and the collectors of the first input transistors of the alternate stages 342, 346, 350, 354 and 358, are each connected to a second common node 380b at the emitter of the second cascode-connected output transistor 370b. Each folding stage includes a current source such as the current source 340c of the folding stage 340, which is connected to the emitters of the input transistors of the folding stage. The collectors of each of the output transistors 370a and 370b are each connected to ground through an associated load resistor 372a and 372b, respectively. The folding circuit 300 has a differential output $V_{out}$ between the collectors of the output transistors 370a and 370b.

In operation, it is seen that each folding stage has associated therewith a particular differential input voltage at which the differential input transistors of that particular stage will both be turned on equally so that the currents passing through the respective collectors of the differential input pair will be balanced or equal. Thus, for example, in the illustrated embodiment, application of the full scale differential input voltage FS to the differential inputs of the differential resistive ladder 310 causes the input transistors 358a and 358b to be equally turned on so as to have balanced collector currents. As shown in FIG. 3(b), the inputs of the input differential pair of the folding stage 358 are connected to the differential resistive ladder nodes 9 and $\overline{1}$, respectively. Thus, when the differential input voltage is equal to the full scale value FS, the voltages at nodes 9 and $\overline{1}$ will be equal. At this input voltage, the voltages at nodes 0–8 of the resistive ladder 314a–323a will be greater than the corresponding voltages at the nodes 10–2 the resistive ladder 314b–323b such that the first input transistors 340a–356a of each of the folding stages 340–356 will be turned on, drawing all or substantially all of the current $I_p$, whereas the second input transistor 340b–356b of the folding stages 340–356 will be turned off. Conversely, when the input voltage is equal to the full scale value FS, the voltage at node 10 will be less than the corresponding voltage at nodes $\overline{0}$, respectively. Hence, the first input transistor 360a of the folding stage 360 will be turned off whereas the second input transistor 360b of the folding stage 360 will be turned on drawing the full current $I_p$. Consequently, at the full scale input voltage FS, the output $V_{out}$ of the folding circuit 300 will be balanced, that is, at a zero crossing as shown in FIG. 4. If the input voltage falls below the full scale value by one threshold voltage, i.e., the voltage across one threshold resistor of the differential resistive ladder, the voltages at the nodes 8 and $\overline{2}$, respectively, will be equal rather than the voltages at the nodes 9 and $\overline{1}$ discussed above. Consequently, the input transistors 356a and 356b of the folding stage 356 will both be turned on, causing the output voltage $V_{out}$ to pass through another zero crossing. The output voltage will pass through a zero crossing each time the voltages at the complementary nodes are equal as indicated in FIG. 4. The above described arrangement has several advantages. For example, it should be noted that of the input differential transistors of the folding stages, half of the transistor inputs are coupled to one resistive ladder 314a–323a whereas the other half of the transistor inputs are coupled to the other resistive ladder 314b–323b of the differential resistive ladder 310. As a consequence, a partial cancellation of the collector-base capacitance of the input transistors occurs, reducing the capacitive loading on the resistive ladders. For example, if a voltage spike is capacitively coupled by the collector-base capacitance of the input transistors 340a, 344a, 348a, 352a, 356a and 360a to the emitter of the cascode output transistor 370a, a substantially complementary voltage spike will be coupled through the second input transistors 342b, 346b, 350b, 354b, and 358b to the emitter of the cascode output transistor 370a, thereby substantially nulling out the voltage spike. Other warping which has an even ordered characteristic is also rejected because of the differential nature of the input. As a consequence, disturbances to the zero crossings of the output which might be caused by even ordered warping will be reduced.

Another advantage of the folding circuit of the present invention is that the cascode-connected output transistors 370a and 370b substantially reduce the impedances at nodes 380a and 380b at the emitters of the transistors 370a and 370b, respectively. As previously mentioned, the collector-base capacitances of the input transistors of the folding stages provide a substantial capacitance at the nodes 380a and 380b, respectively. However, because the resistances of the cascode transistors 370a and 370b as measured with respect to the emitters of the transistors are quite low, the effective impedances at nodes 380a and 380b are substantially reduced. As a consequence, the currents at the nodes 380a and 380b can change rapidly in response to changes in the differential input signal to the differential resistance ladder 310. The bases of the cascode-connected transistor 370a and 370b are coupled to voltage sources of sufficient value to ensure operation of the transistors 370 and 370b in the active region.

In addition to the load resistors 372a and 372b, the output portion of the folding circuit 300 also includes debiasing resistors 382a and 382b coupled to the nodes 380a and 380b, respectively. The debiasing resistors 382a and 382b remove a substantial portion of the biasing current so as to avoid a large DC drop across the load resistors 372a and 372b. However, even with the addition of the debiasing resistors 382a and 382b, it is seen that the output portion of the folding circuit 300 has only four resistors, the load resistors 372a, and 372b and the debiasing resistors 382a and 382b. All signal current flows through these resistors and therefore the output portion has relatively few resistors that need to be matched to each other. In contrast, the folding circuit of FIG. 2 has a load resistor for each folding stage of the circuit. Thus, if the folding circuit of FIG. 2 had eleven folding stages, eleven load resistors would be required and each of the load resistors should be properly matched to ensure proper operation of the circuit.

As noted above, application of a full scale input voltage FS causes the folding stage 358 coupled to the input nodes 9 and $\overline{1}$ to be balanced producing a zero crossing. Similarly, as shown in FIG. 4, application of a negative full scale voltage −FS to the differential input causes the folding stage 342 coupled to the nodes 1 and $\overline{9}$ to produce a zero crossing. Thus, the folding circuit 300 of the illustrated embodiment has two additional folding stages 340 and 360, one at each end of the array of folding stages, to ensure that the sinusoidal output is maintained, even at the full scale extremes of the input voltage as shown in FIG. 4. For example if the differential input voltage is such that the voltages at nodes 0 and $\overline{10}$ are equal, the input transistor 342a of the next stage 342 may not be fully off due to the imbalance at the ends of the array. This imbalance causes a disturbance in the output voltage when the input voltage is less than −FS or greater than +FS as shown in FIG. 4. Consequently, the underflow and overflow stages 340 and 360 have been added to ensure that any distortion occurs outside the range of interest, i.e., −FS to +FS.

Figure 3A:
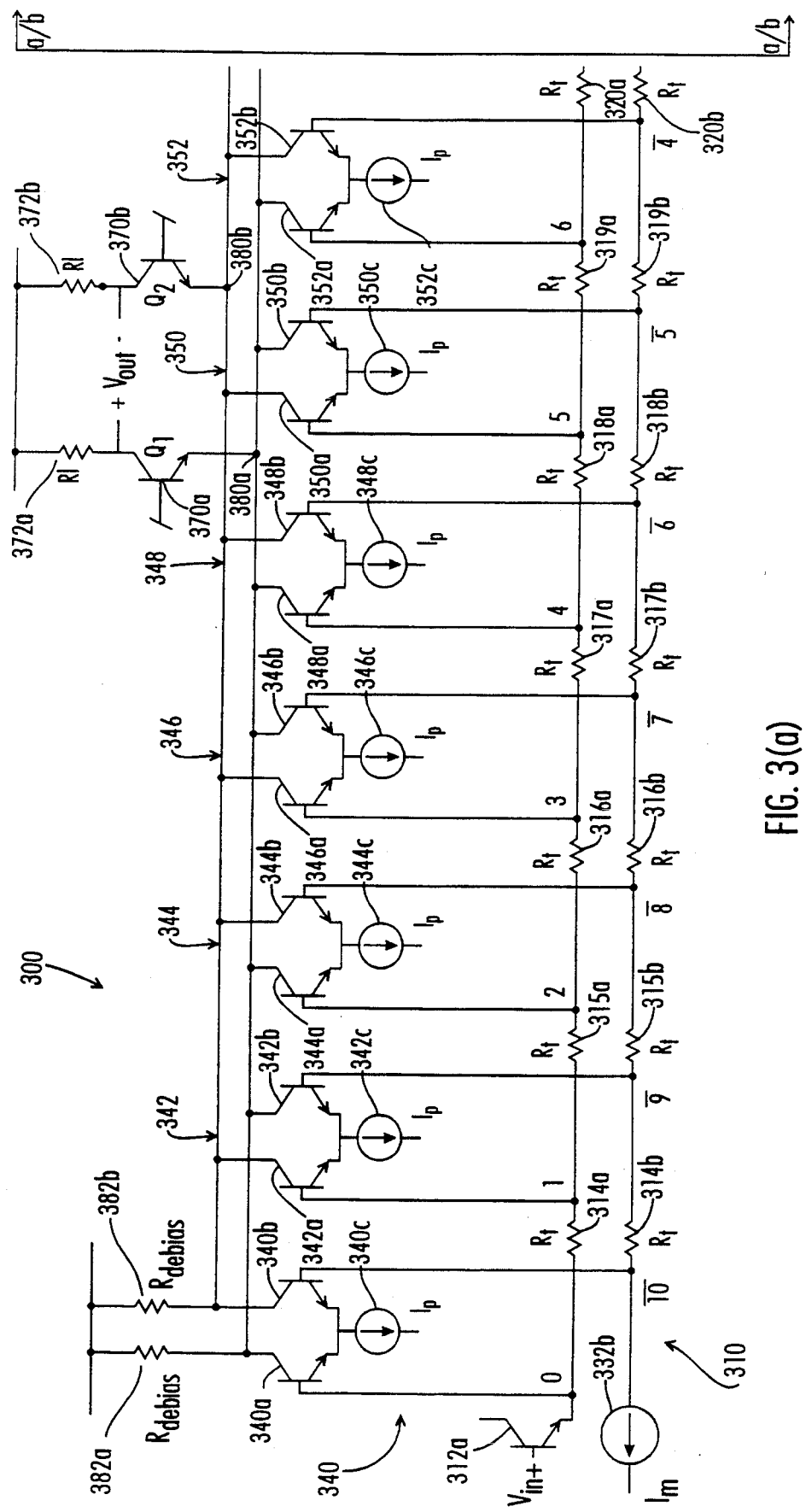
FIGS. 3(a) and 3(b) are schematic diagrams of a folding circuit in accordance with a preferred embodiment of the present invention.
Figure 3B:
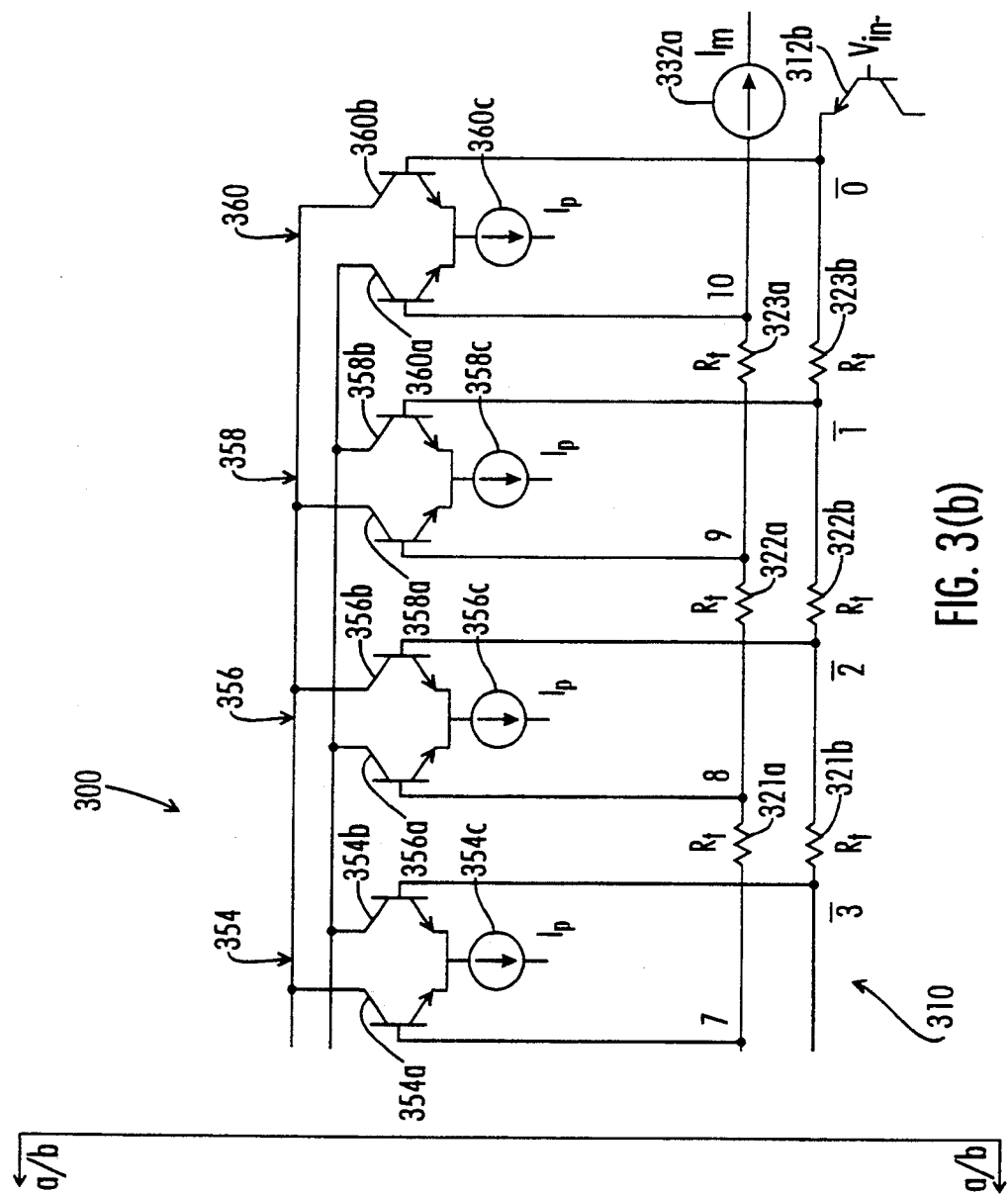
Figure 4:
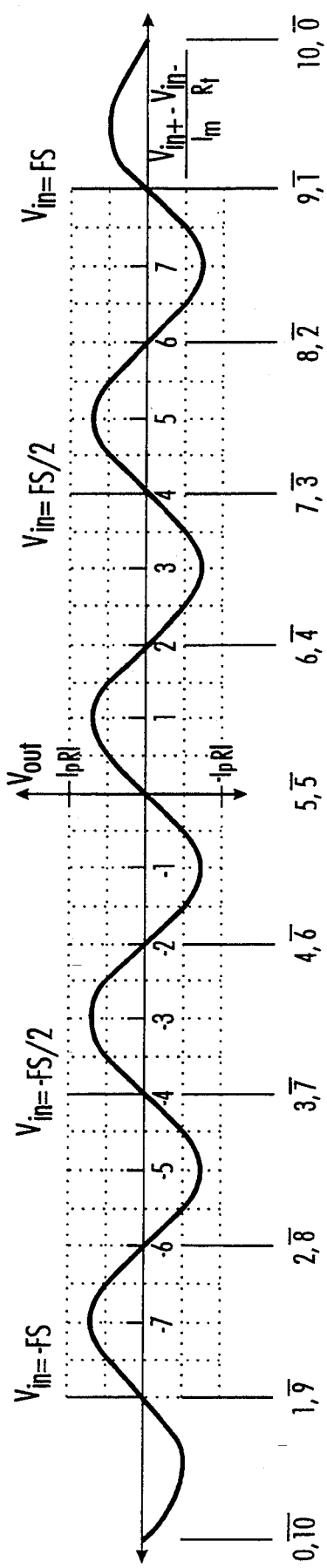
FIG. 4 is a graph depicting the sinusoidal output of the folding circuit of FIGS. 3(a) and 3(b).

Differential resistive ladders such as the differential resistive ladder 310 of FIGS. 3(a) and 3(b) can be used not only in folding type analog-to-digital converters but in other types of "flash" or parallel A/D converters as well. As previously mentioned, the voltages at adjacent nodes of the resistive ladder are separated by a threshold voltage which is the voltage drop across the resistor separating the two adjacent nodes. This threshold voltage (also known as the least significant bit (LSB) voltage) is given by the following relationship:

$$V_{LSB} = R_T \times I_M / A$$

where $R_T$ is the resistance value of each threshold resistor, $I_M$ is the current provided by the current sources 332a and 332b, and A (ideally unity) is the gain of the resistive ladder 310. The gain A of the ladder 310 is a function of the ladder resistance, the ladder current and the base currents flowing into the comparators. Since the resistance of the ladder is typically not well controlled in most fabrication processes, the gain of such a ladder can be set by using a replica of the actual differential ladder 310 in a feedback loop. However, even if the replica resistive ladder is an exact duplicate, the gain of the replica resistive ladder usually does not precisely match that of the main resistive ladder because the comparators coupled to the main resistive ladder draw currents which affect the gain of the main resistive ladder. As a consequence, the gain set by the replica resistive ladder through the feedback loop may contain an error which can distort the output of the analog-to-digital circuit.

One approach to correct this error would be to provide a complete set of comparators duplicating those coupled to the main resistive ladder. The duplicate set of comparators could draw current from the replica resistive ladder in the same manner that the main comparators draw current from the main resistive ladder. As a result, the gain set through the feedback loop would be properly matched. However, for many applications, the increased power consumption and required fabrication space of the replica comparators would make such a duplicate set of comparators impractical.

Figure 5:
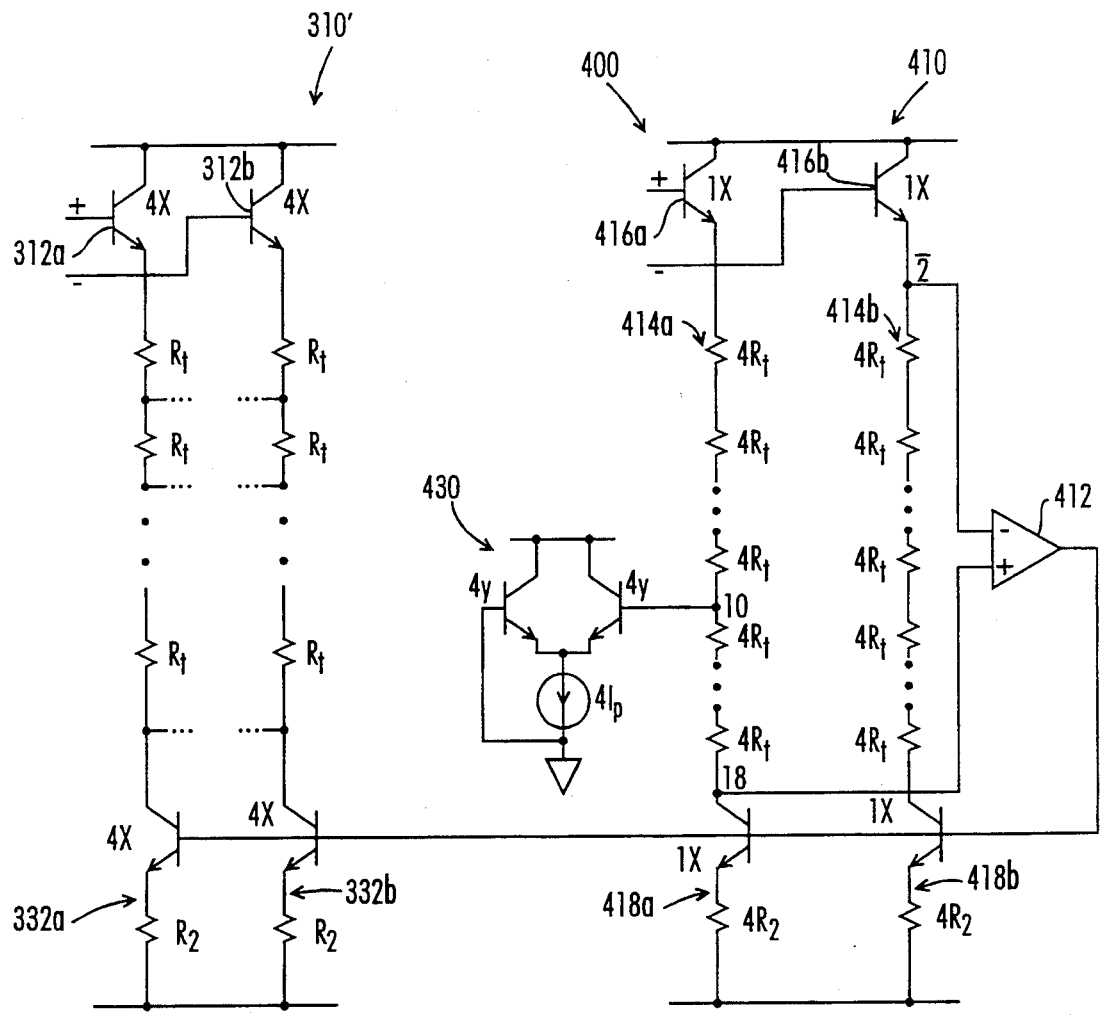
FIG. 5 is a schematic diagram of a replica gain matching circuit for a differential resistive ladder in accordance with another aspect of the present invention.

In another aspect of the present invention, the gain error in a replica gain matching circuit is avoided by scaling the replica circuit by an integer ratio to the main resistive ladder and coupling a comparator of appropriate size to the replica ladder such that the replica ladder requires as few as one replica comparator to ensure correct gain matching. FIG. 5 shows a replica gain matching circuit 400 in accordance with a preferred embodiment of the present invention, for setting the gain of a differential resistive ladder 310' similar to the resistive ladder 310 of FIGS. 3(a) and 3(b). In FIG. 5, the comparators of the folding stages 340-360 of FIGS. 3(a) and 3(b) have been omitted for purposes of clarity. In the illustrative embodiment, the differential resistive ladder 310' may also be used in conjunction with a second set of eleven folding stages (not shown) to provide a second sinusoidal output. The resistive ladder 310' may have twenty-one voltage taps or nodes with the eleven pairs of comparator inputs of the eleven folding stages 340-360 coupled to eleven complementary voltage tap pairs as described above, and ten pairs of comparator inputs of the second set of folding stages coupled to ten complementary voltage taps which are interleaved with the voltage taps of the folding stages 340-360. Because the voltage taps of the two sets of folding stages are interleaved, the output of the second set of folding stages will be a cosinusoidal output phase shifted with respect to the sinusoidal output of the first set of folding stages 340-360. The sinusoidal and cosinusoidal outputs can be combined in various combinations to provide a plurality of sinusoidal outputs, each having a different zero crossing for interpolation.

The replica gain matching circuit 400 includes a replica differential resistive ladder 410 and a differential amplifier 412, one input of which is coupled to a bottom node, i.e., node 18, of a twenty-one node first resistive leg or ladder 414a of the differential resistive ladder 410, and a second input coupled to a first node, i.e., node 2, of a second twenty-one node resistive leg or ladder 414b of the differential resistive ladder 410. Each resistive ladder 414a and 414b has an input transistor 416a and 416b, respectively, and a variable current source 418a and 418b, respectively, coupled in a manner similar to that of the main differential resistive ladder 310'. Each of the current sources 418a and 418b of the replica differential resistive ladder 410 and the current sources 332a and 332b of the main differential resistive ladder 310' include a transistor, the emitter of which is coupled to a resistor $R_2$. The output of the differential amplifier 412 of the replica gain matching circuit 410 is coupled to the control input, i.e., the bases, of the transistors of each of the variable current sources 418a and 418b of the replica gain matching circuit 410 and the variable current sources 332a and 332b of the main differential reference ladder 310'.

To set the gain of the main differential resistive ladder 310', a reference signal equal to the full scale value FS of the input signal of the main differential resistive ladder 310' is applied across the control inputs of the input transistors 416a and 416b of the replica resistive ladder 410. If the transistor and resistor components of the replica resistive ladder 410 are precisely matched to those of the corresponding circuit elements of the main differential resistive ladder 310', and if the currents drawn by the folding stages coupled to the differential resistive ladder 310' are ignored, the differential amplifier 412 will drive the current sources of the differential resistive ladders and thereby set the gain of the main differential resistive ladder 310' to ensure that the threshold voltage or $V_{LSB}$, is at the desired incremental value, notwithstanding variations in the threshold resistance $R_T$. However, for very high accuracy applications, the currents drawn by the folding stages coupled to the main differential resistive ladder 310' induce a gain error which is too large to ignore. To overcome this problem, the replica gain matching circuit 400 of the illustrated embodiment further includes a scaled differential pair comparator 430 which has been scaled to a predetermined size and connected to the replica reference ladder 410 at a predetermined tap point, to replicate the currents drawn by the folding stages coupled to the main reference ladder 310'. As a consequence, the gain error and the resultant distortion in the analog-to-digital conversion output is substantially compensated.

Figure 6:
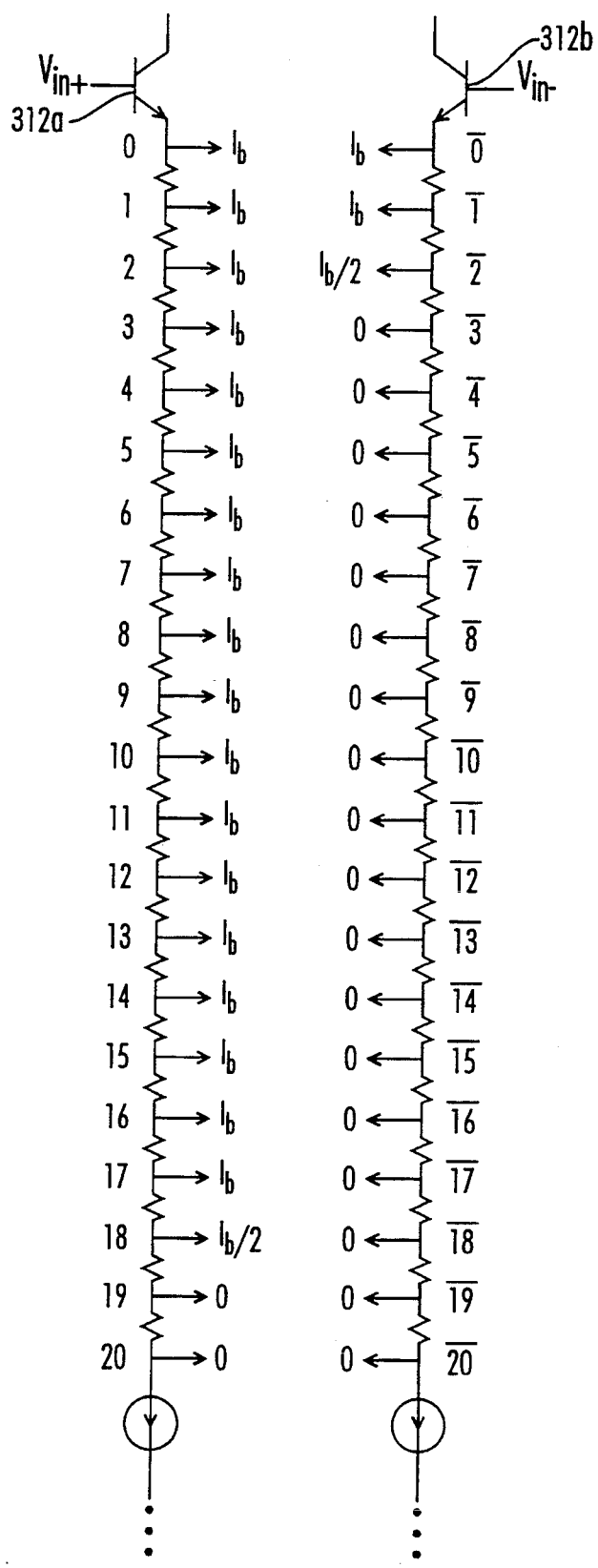
FIG. 6 is a schematic diagram illustrating the base currents drawn by comparators when the differential input voltage is the full scale value.

The following is an explanation of how the size of the added comparator 430 may be calculated, together with an explanation of how the particular tap point may be determined, in order to replicate the currents drawn by the folding stages. When the differential input voltage equals the full scale value FS, the voltages at nodes 18 and $\overline{2}$ of the main differential reference ladder 310' are both equal such that the base currents drawn by the transistors 358a and 358b of the folding stage 358 are also equal. This is indicated in FIG. 6 in which the base current drawn from node 18 is represented as $I_b/2$ and similarly, the base current drawn from node 2 is represented by the same value, i.e., $\overline{I}_b/2$. Because the input transistors 340a-356a of the folding stages 340-356, respectively, which are coupled to the even nodes 0-16 of the differential resistive ladder 310' are all on, each input transistor 340a-356a draws the full base current $I_b$ from the associated even nodes 0, 2, 4 . . . 16 as shown in FIG. 6. Similarly, the first input transistor of the stages of the second set of stages coupled to the odd nodes 1, 3, 5 . . . 17 draws the full base current $I_b$. However, the input transistor 360a of the folding stage 360 is off. Hence, the node 20 coupled to the input transistor 360a is shown as providing zero base current in FIG. 6. Similarly, the first input transistor of the stage of the second set of stages coupled to the node 19 is off and draws zero base current. Also, the node $\overline{0}$ coupled to the second input transistor 360b of the folding stage 360 is fully on and therefore draws the full base current $I_b$ from the node $\overline{0}$. Similarly, the second input transistor of the stage of the second set of stages coupled to node $\overline{1}$ is off and draws zero current. Conversely, the second input transistor of the stages coupled to $\overline{3-20}$ are all off and therefore, the nodes $\overline{3-20}$ are all shown as providing zero base current in FIG. 6.

Figure 7:
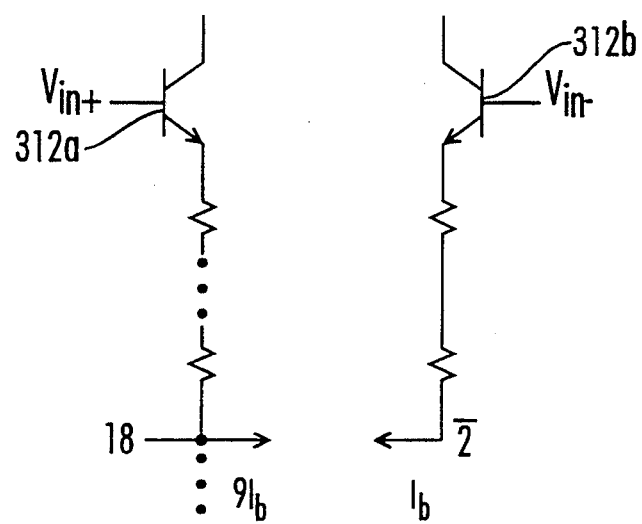
FIG. 7 is a schematic diagram of a replica differential reference ladder having base currents scaled in accordance with the base currents depicted in FIG. 6.

In accordance with the present invention, it is seen that the base currents provided by the differential resistive ladder can be combined in a manner which will substantially simplify the replica circuit, yet ensure accurate gain matching. Specifically, with the full scale differential input voltage applied across the reference ladder as shown in FIG. 6, it is seen that the current $I_b$ flowing out of node 1 can be moved up to node 0 if the current $I_b$ flowing out of node 17 is moved down to node 18, without any effect on the voltage at node 18 (assuming a large $g_m$ in the emitter follower input transistors 312a and 312b). The base currents $I_b$ flowing out of each of the nodes 2-8 can likewise be moved up to node 0 if the base currents $I_b$ flowing out of the nodes 10-16 are moved down to node 18. The remaining base current $I_b$ flowing out of node 9 can be moved up to node 0 if the base current out of node 18 is increased by $I_b/2$ to $I_b$ (since the total resistance between nodes 0 and 18 is twice that of the total resistance between nodes 0 and 9). The same operation of combining currents can be performed the complementary resistance ladder of nodes $\overline{0-20}$ wherein the base current $I_b$ drawn out of node $\overline{1}$ is moved up to node $\overline{0}$ by increasing the base current drawn out of node $\overline{2}$ by $I_b/2$ to $I_b$. Thus, the currents can be combined so that 9 $I_b$ is drawn from node 18 and 1 $I_b$ is drawn from node 2 as shown in FIG. 7. (The currents from nodes 0 and 0 can effectively be ignored because of the large $g_m$ of the input transistors.)

The differential voltage between nodes 18 and 2 may therefore be represented by the following relationship:

$$V_{18} - V_2{}^- = V_{in+} - V_{in-} - (18 \times 9)I_b R + (2 \times 1)I_b R$$

$$= V_{in+} - V_{in-} - 160 I_b R$$

Thus, the current drawn by the folding stages 340-358 when the full scale input voltage is applied may be replicated by drawing 160 $I_b$ from node 1 or 10 $I_b$ from node 16 (since the total resistance between nodes 0 and 16 is sixteen times that of the resistance between nodes 0 and 1) or 16 $I_b$ from node 10.

In the illustrated embodiment, the replica circuit 400 is selected to be a one-quarter scale version of the actual differential resistive ladder 310'. Therefore, to scale the current to a one-quarter scale, all of the resistors of the replica ladder 410 have four times the resistance value of the resistor $R_T$ of the actual differential resistive ladder 310'. Hence, the resistors of the replica resistive ladder 410 are designated in FIG. 5 as 4 $R_T$, i.e., 4 times the value of the threshold resistors $R_T$ of the main differential resistive ladder 310'. Conversely, the transistors of the replica resistive ladder 410 are scaled down to one-fourth the size of the corresponding transistors of the actual differential resistive ladder 310'. Consequently, the transistors of the main differential resistive ladder 310 are designated 4×, whereas the transistors of the replica resistive ladder 410 are designated 1×, to indicate a size one-fourth that of the corresponding transistors of the main ladder 310.

Because the replica ladder 410 has been scaled to be a one-quarter scale version of the main ladder 310, the full scale value of 16 $I_b$ calculated above should not be drawn from node 10 to replicate the base currents drawn by the first and second sets of folding stages. Instead, one-fourth of the calculated current of 16 $I_b$, or 4 $I_b$, should be drawn from node 10. To draw a base current of 4 $I_b$ from node 10 of the replica ladder 410, the differential pair transistors of the comparator 430 added to the replica circuit 410 should be four times the size of the comparator input devices 340a-360a and 340b-360b in FIGS. 3(a) and 3(b). Also, the current source of comparator 430 should have the value of 4 $I_p$ where $I_p$ is the current value of the current sources of the comparators of FIGS. 3(a) and 3(b).

A convenient way to form each transistor of the differential pair of the comparator 430 is to form four transistors and couple the collectors, bases and emitters, respectively, in parallel. The resultant parallel-coupled transistor will have an effective size four times that of the corresponding devices of the folding circuit of FIGS. 3(a) and 3(b). Although the resistive legs 414a and 414b have been depicted as a plurality of series-connected resistors of equal size, it is recognized of course that the resistive legs may be implemented with single resistors of appropriate size between nodes 0 and 10, nodes 10 and 20, and nodes 0 and 20, respectively.

Thus, it has been found that by coupling a comparator comprising a differential pair to the appropriate node of the replica ladder and scaling the differential pair to draw an appropriate base current, the base currents drawn by the entire comparator array coupled to the main differential ladder can be effectively replicated by the single comparator. In this manner, the gain of the main differential ladder can be accurately set using a replica gain matching circuit having a substantially fewer number of comparators as compared to that of the main differential ladder.

As set forth above, a folding circuit in accordance with a preferred embodiment of the present invention has a substantially reduced number of resistors so as to facilitate accurate matching of the output resistors. In addition, the circuit has a significantly reduced number of comparators in a replica gain matching circuit to efficiently ensure accurate conversion outputs. Still further, the converter includes a differential resistive ladder in which cancellation of the effective capacitance of the comparators is substantially achieved thereby substantially reducing capacitive loading on the differential resistive ladder.

It will, of course, be understood that modifications of the present invention, in its various aspects, will be apparent to those skilled in the art, some being apparent only after study and other being matters of routine electronic design and semiconductor fabrication techniques. As such, the scope of the invention should not be limited by the particular embodiments herein described but should be defined only by the appended claims and equivalents thereof.

We claim:

1. A folding circuit for folding a differential analog input signal, comprising:

a differential resistance ladder which includes a first plurality of series-connected resistors having a first plurality of tap points along the series-connected resistors, a second plurality of series-connected resistors having a second plurality of tap points along the second plurality of series-connected resistors, and a current source coupled to the first and second pluralities of series-connected resistors;

first and second analog inputs for applying the differential analog input signal to the differential resistance ladder;

first and second differential analog outputs for providing a differential analog output signal; and a plurality of folding stages, each folding stage having a first analog output coupled to one of the first and second differential analog outputs, a first analog input coupled to a tap point of the first plurality of series-connected resistors, a second analog output coupled to one of the first and second differential analog outputs, and a second input coupled to a tap point of the second plurality of series-connected resistors;

wherein the differential analog output signal is the folded function of the differential analog input signal.

2. The circuit of claim 1 wherein each resistor of a plurality of series-connected resistors defines a voltage threshold, the folding circuit has a folding stage associated with each voltage threshold, the differential input signal has a full scale range and the total voltage drop of the plurality of voltage thresholds exceeds the full scale range.

3. The folding circuit of claim 1 wherein each folding stage has a first transistor having an input and an output and the first analog input and the first analog output of the folding stage comprise the first transistor input and output, respectively, and a second transistor having an input and an output and the second analog input and the second analog output of the folding stage comprise the second transistor input and output, respectively, and wherein a portion of the folding stages have their first and second transistor outputs coupled to the first and second differential analog outputs, respectively, and the remainder of the folding stages have their first and second transistor outputs coupled to the second and first differential analog outputs, respectively.

4. The circuit of claim 2 wherein a folding stage of said plurality of folding stages has inputs coupled to voltage taps outside the full scale range.

5. A folding circuit comprising:
a differential resistance ladder which includes a first plurality of series-connected resistors having a first plurality of tap points along the series-connected resistors, a second plurality of series-connected resistors having a second plurality of tap points along the second plurality of series-connected resistors, and a current source coupled to the first and second pluralities of series-connected resistors;
first and second inputs for applying a differential input signal to the differential resistance ladder;
first and second differential outputs for providing a differential output signal;
a plurality of comparators, each comparator having a first output coupled to one of the first and second differential outputs, a first input coupled to a tap point of the first plurality of series-connected resistors, a second output coupled to one of the first and second differential outputs, and a second input coupled to a tap point of the second plurality of series-connected resistors; and
a first cascode-connected transistor coupled between the first differential output and the comparator outputs coupled to the first differential output, and a second cascode-connected transistor coupled between the second differential output and the comparator outputs coupled to the second differential output.

6. The circuit of claim 5 wherein each cascode-connected transistor has an emitter, the circuit further comprising a first debias resistor coupled to the emitter of the first cascode-connected transistor and a second debias resistor coupled to the emitter of the second cascode-connected transistor.

7. A replica gain matching circuit for a first differential resistance ladder which includes a first resistive leg comprising a first plurality of series-connected resistors, a second resistive leg comprising a second plurality of series-connected resistors, and a first variable current source coupled to the first and second pluralities of series-connected resistors, said variable current source having a control input; a first input for applying an input signal to the first differential resistance ladder; and a first plurality of comparators, each comparator having a pair of inputs coupled to the first and second pluralities of series-connected resistors, respectively; the replica gain matching circuit comprising:
a second differential resistance ladder which includes a third resistive leg, a fourth resistive leg and a second variable current source coupled to the third and fourth resistive legs, said second variable current source having a control input;
a reference input for applying a reference signal to the second differential resistance ladder;
at least one additional comparator coupled to one of the third and fourth resistive legs; and
a differential amplifier having first and second inputs coupled to the third and fourth resistive legs of the second differential resistance ladder, and an output coupled to the control inputs of the first and second variable current sources.

8. The circuit of claim 7 wherein each comparator comprises a differential pair of bipolar transistors, and the differential pair of bipolar transistors of said one additional comparator is scaled to draw a base current which is a function of the base currents drawn by the first plurality of comparators coupled to the first and second pluralities of series-connected resistors.

9. The circuit of claim 8 wherein the base current of said one additional comparator is proportional to the base currents drawn by the first plurality of comparators when the input signal applied to the first differential resistance ladder is substantially equal to the reference signal applied to the second differential resistance ladder.

10. The circuit of claim 9 wherein the total resistance value of each resistive leg of the second differential resistance ladder is a multiple of the total resistance value of each of the first and second resistive legs of the first differential resistance ladder.

11. The circuit of claim 10 wherein the base current of said one additional comparator is scaled down by a factor equal to said multiple.

12. The circuit of claim 10 wherein the multiple is an integer multiple.

13. The circuit of claim 11 wherein the multiple is an integer multiple.

14. A folding circuit comprising:
a differential resistance ladder which includes a first plurality of series-connected resistors having a first plurality of tap points along the series-connected resistors, a second plurality of series-connected resistors having a second plurality of tap points along the second plurality of series-connected resistors, and a current source coupled to the first and second pluralities of series-connected resistors;
first and second inputs for applying a differential input signal to the differential resistance ladder;
first and second differential outputs for providing a differential output signal;
a plurality of comparators, each comparator having a first output coupled to one of the first and second differential outputs, a first input coupled to a tap point of the first plurality of series-connected resistors, a second output coupled to one of the first and second differential outputs, and a second input coupled to a tap point of the second plurality of series-connected resistors;
wherein each resistor of a plurality of series-connected resistors defines a voltage threshold, the folding circuit has a comparator associated with each voltage threshold, the differential input signal has a full scale range and the total voltage drop of the plurality of voltage thresholds exceeds the full scale range; and
wherein a comparator of said plurality of comparators has inputs coupled to voltage taps outside the full scale range.

15. An analog to digital converter, comprising:
a differential resistance ladder which includes a first input, a first current source, a plurality of series-connected resistors coupled between the first input and the first current source and having a first plurality of sequential tap points along the series-connected resistors, each resistor providing a threshold voltage drop, a second input, a second current source, and a second plurality of series-connected resistors coupled between the second input and the second current source and having a second plurality of sequential tap points along the second plurality of series-connected resistors, each resistor providing a threshold voltage drop;

first and second common nodes;

a first plurality of comparators, each comparator having a first output coupled to the first common node, a first input coupled to a tap point of the first plurality of series-connected resistors, a second output coupled to the second common node, and a second input coupled to a tap point of the second plurality of series-connected resistors;

a second plurality of comparators, each comparator having a first output coupled to the second common node, a first input coupled to a tap point of the first plurality of series-connected resistors, a second output coupled to the first common node, and a second input coupled to a tap point of the second plurality of series-connected resistors, said inputs of the first and second plurality of comparators being coupled to the taps of the associated series-connected resistors in alternating sequence;

first and second differential outputs for providing a differential output signal;

a first cascode-connected transistor coupled between the first differential output and the first common node;

a second cascode-connected transistor coupled between the second differential output and the second common node;

a first load resistor coupled to the first differential output;

a second load resistor coupled to the second differential output;

a first debias resistor coupled to the first common node; and a second debias resistor coupled to the second common node.

16. A folding circuit comprising:

a differential resistance ladder which includes a first plurality of series-connected resistors having a first plurality of tap points along the series-connected resistors, a second plurality of series-connected resistors having a second plurality of tap points along the second plurality of series-connected resistors, and a current source coupled to the first and second pluralities of series-connected resistors;

first and second inputs for applying a differential input signal to the differential resistance ladder;

first and second differential outputs for providing a differential output signal;

a plurality of comparators, each comparator having a first output coupled to one of the first and second differential outputs, a first input coupled to a tap point of the first plurality of series-connected resistors, a second output coupled to one of the first and second differential outputs, and a second input coupled to a tap point of the second plurality of series-connected resistors; and a first load resistor coupled to the first differential output and a second load resistor coupled to the second differential output.

17. An analog to digital converter, comprising:

a differential resistance ladder which includes a first input, a first current source, a plurality of series-connected resistors coupled between the first input and the first current source and having a first plurality of sequential tap points along the series-connected resistors, each resistor providing a threshold voltage drop, a second input, a second current source, and a second plurality of series-connected resistors coupled between the second input and the second current source and having a second plurality of sequential tap points along the second plurality of series-connected resistors, each resistor providing a threshold voltage drop;

first and second common nodes;

a first plurality of comparators, each comparator having a first output coupled to the first common node, a first input coupled to a tap point of the first plurality of series-connected resistors, a second output coupled to the second common node, and a second input coupled to a tap point of the second plurality of series-connected resistors;

a second plurality of comparators, each comparator having a first output coupled to the second common node, a first input coupled to a tap point of the first plurality of series-connected resistors, a second output coupled to the first common node, and a second input coupled to a tap point of the second plurality of series-connected resistors, said inputs of the first and second plurality of comparators being coupled to the taps of the associated series-connected resistors in alternating sequence;

first and second differential outputs for providing a differential output signal;

a first cascode-connected transistor coupled between the first differential output and the first common node;

a second cascode-connected transistor coupled between the second differential output and the second common node;

a first load resistor coupled to the first differential output;

a second load resistor coupled to the second differential output;

a first debias resistor coupled to the first common node;

a second debias resistor coupled to the second common node;

a second differential resistance ladder which includes a third resistive leg, a fourth resistive leg and a second variable current source coupled to the third and fourth resistive legs, said second variable current source having a control input;

a reference input for applying a reference signal to the second differential resistance ladder;

at least one additional comparator coupled to one of the third and fourth resistive legs; and a differential amplifier having first and second inputs coupled to the third and fourth resistive legs of the second differential resistance ladder, and an output coupled to the control inputs of the first and second variable current sources;

wherein each comparator comprises a differential pair of bipolar transistors, and the differential pair of bipolar transistors of said one additional comparator is scaled to draw a base current which is a function of the base currents drawn by the first and second pluralities of comparators coupled to the first and second pluralities of series-connected resistors.

* * * * *